(12) United States Patent
Wu et al.

(10) Patent No.: US 9,373,382 B1
(45) Date of Patent: Jun. 21, 2016

(54) METHOD FOR HEALING PHASE-CHANGE MEMORY DEVICE AND APPLICATIONS THEREOF

(71) Applicant: MACRONIX INTERNATIONAL CO., LTD., Hsinchu (TW)

(72) Inventors: Chao-I Wu, Hsinchu (TW); Win-San Khwa, Taipei (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/689,101

(22) Filed: Apr. 17, 2015

(51) Int. Cl.
*G11C 11/00* (2006.01)
*G11C 13/00* (2006.01)
*H01L 45/00* (2006.01)

(52) U.S. Cl.
CPC ............ *G11C 11/00* (2013.01); *G11C 13/0004* (2013.01); *G11C 13/004* (2013.01); *H01L 45/1641* (2013.01)

(58) Field of Classification Search
CPC ............. G11C 13/004; G11C 13/0004; G11C 45/1641; G11C 45/06; G11C 2924/351; G11C 2212/1032
See application file for complete search history.

(56) References Cited

U.S. PATENT DOCUMENTS

| | | | | |
|---|---|---|---|---|
| 2009/0168504 A1* | 7/2009 | Lee | ................... | G11C 13/0004 365/163 |
| 2009/0279349 A1* | 11/2009 | Shih | ................... | H01L 27/2436 365/163 |
| 2012/0327708 A1* | 12/2012 | Du | ................... | G11C 13/0021 365/163 |

* cited by examiner

*Primary Examiner* — Harry W Byrne
*Assistant Examiner* — Ajay Ojha
(74) *Attorney, Agent, or Firm* — McClure, Qualey & Rodack, LLP

(57) ABSTRACT

A method for healing phase-change memory device includes steps as follows: At least one memory cell comprising a phase-change material with a shifted current-resistance characteristic function (shifted I-R function) is firstly provided. A healing stress is then applied to the phase-change material to transform the shifted I-R function into an initial current-resistance characteristic function (initial I-R function), wherein the shifted I-R function is a translation function of the initial I-R function.

16 Claims, 6 Drawing Sheets

METHOD FOR HEALING PHASE-CHANGE MEMORY DEVICE AND APPLICATIONS THEREOF

BACKGROUND

1. Technical Field

The disclosure of the present invention generally relates to a method for healing a phase-change memory device and the applications thereof, and more particularly to a method for healing a phase-change memory device with chalcogenide-based based material or other suitable material and the applications thereof.

2. Description of the Related Art

Phase-change based memory materials, such as chalcogenide-based materials and similar materials, can be caused to change phase between an amorphous phase and a crystalline phase by application of electrical current at levels suitable for implementation in integrated circuits. In comparison with the crystalline phase, the amorphous phase is characterized by a higher electrical resistivity which can be readily sensed to indicate data. These properties may cause the chalcogenide-based materials suitable for serving as programmable resistive material to form nonvolatile memory circuits, which can be read and written with random access, e.g a phase-change memory devices.

A phase-change memory device can be read and written with random access by the transformations between the amorphous phase and the crystalline phase occurring on the chalcogenide-based materials disposed in the active area of the phase-change memory device. For example, the phase of the chalcogenide-based materials (phase-change materials) disposed in the active area of the phase-change memory device may be transformed from the amorphous phase to the crystalline phase when a low-voltage electric pulse is applied to the active area of the memory cells, whereby the resistance states of the memory cells involved in the phase-change memory device may be transformed either from an initial state 103 or from a high resistance state 102 to a low resistance state 101. The process of transforming resistance state form high to low is referred as a set process. Alternatively, the low resistance state 101 of the memory cells may be transformed to the high resistance state 102 again by applying a high-voltage electric pulse to the active area of the memory cells in order to transform the crystalline phase of the chalcogenide-based materials to the amorphous phase. The process of transforming resistance state form low to high is referred as a reset process.

FIG. 1 is a distribution graph of memory cells with various resistance states in a prior art phase-change memory device, wherein each of the memory cells may either have a high resistance state 102 or have a low resistance state 101 without overlapped with the high resistance state 102 by the set process or the reset process. There is a gap between the highest resistance R1 of the high resistance state 102 and the lowest resistance R2 of the low resistance state 101 used to determine what the resistance state a memory cell has. The data stored in a memory cell may be referred as "0" when the resistance state of the memory cell is determined less than a threshold limit value (threshold resistance) 103, and the data may be referred as "1" when the resistance state of the memory cell is determined greater than the threshold resistance 103.

However after a plurality numbers of read, set and reset operations are carried out, degradations of the phase-change materials may occur due to the electrical energy applied to the phase-change materials during the set/reset operations, the operation temperature and/or the arrangement of the memory cells. Such that the electrical properties, such as resistance state, relationship between the resistance and the current etc., of the phase-change material may shift from an initial state. For example, the phase-change materials disposed in the active area of the memory cells that has the high resistance state 102 may be recrystallized due to the electrical energy and the thermal stress applied to the phase-change materials during the set and reset operations, and the resistance of the phase-change materials may be reduced gradually, whereby it requires more operation current and bit error of the phase-change memory device may occur when the lowest resistance R2 of the low resistance state 102 is reduced to a level less than the threshold resistance 103.

Therefore, there is a need of providing an improved method for healing a phase-change memory device and the applications thereof to obviate the drawbacks encountered from the prior art.

SUMMARY

One aspect of the present invention is to provide a method for healing a phase-change memory device, wherein the method comprises steps as follows: At least one memory cell comprising a phase-change material with a shifted current-resistance characteristic function (shifted I-R function) is firstly provided. A healing stress is then applied to the phase-change material to transform the shifted I-R function into an initial current-resistance characteristic function (initial I-R function), wherein the shifted I-R function is a translation function of the initial I-R function.

In accordance with another aspect of the present invention, a method for operating a phase-change memory device is provided, wherein the method comprises steps as follows: Firstly, a phase-change memory device having a plurality of memory cells is provided, wherein each of the memory cells has phase-change material. At least one of the memory cells is then treated to make the phase-change material having a shifted I-R function, and the memory cell with the shifted I-R function is then referred to as having a first state. Next, a healing stress is applied to the memory cell with the first state, so as to transform the shifted I-R function of the memory cell into an initial I-R function, wherein the shifted I-R function is a translation function of the initial I-R function. Subsequently, the memory cell with the initial I-R function is referred to as having a second state, and data stored in the memory cells is read in accordance with the first state and the second state.

In accordance with the aforementioned embodiments of the present invention, a method for healing a phase-change memory device is provided. By applying a healing stress to phase-change materials of a memory cell, the degradation of the phase-change materials caused by electrical energy subject to the phase-change materials during the set/reset operations, the operation temperature or the combination thereof can be healed, and the electrical properties, such as the I-R function of the memory cell, can be recovered to return to the initial state. As a result, the problems of bit error and high current consumption caused by the degradation of the phase-change materials can be obviated.

In addition the reversible property between the shifted I-R function and the initial I-R function can provide a new way for accessing data stored in the memory cell. Such that the memory density of the phase-change memory device can be increased significantly without changing the physical structure thereof.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION

Figure 1:
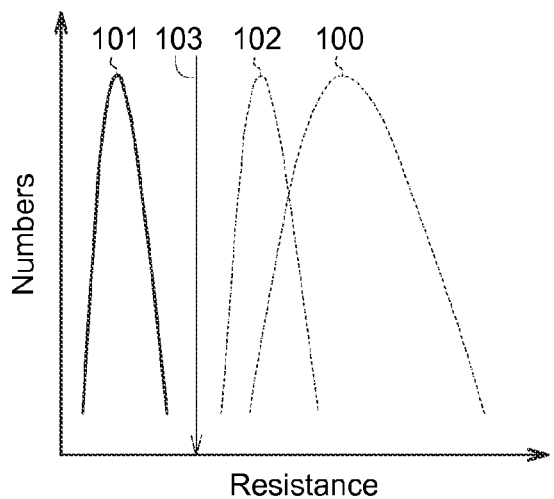
FIG. 1 is a distribution graph of memory cells with various resistance states in a prior art phase-change memory device.

The embodiments as illustrated below provide a method for healing a phase-change memory device to solve the problems of bit error and high current consumption caused by the degradation of the phase-change materials. The present invention will now be described more specifically with reference to the following embodiments illustrating the structure and method for fabricating the memory device.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

Figure 2:
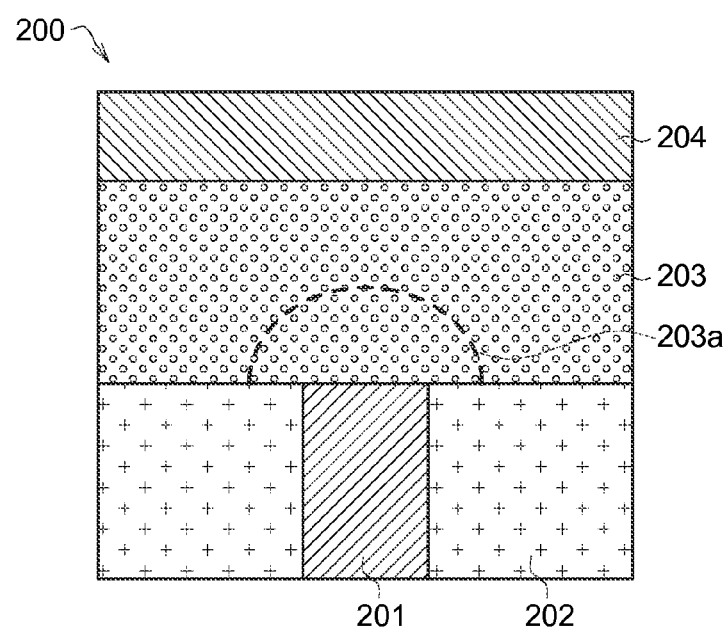
FIG. 2 is a cross-sectional views illustrating a memory cell of a phase-change memory device in accordance with one embodiment of the present invention.

FIG. 2 is a cross-sectional views illustrating a memory cell 200 of a phase-change memory device in accordance with one embodiment of the present invention. In some embodiments of the present invention, a phase-change memory device may comprise a plurality of (e.g. several millions of) the memory cell 200, and each of the memory cells 200 comprises a bottom electrode 201, a dielectric layer 202, a memory layer 203 and a top electrode 204. The bottom electrode 201 extends through the dielectric layer 202. The memory layer 203 comprises phase-change material. The top electrode 204 is disposed on the memory layer 203. In the present embodiment, the bottom electrode 201 is electrically connected to one end of an access device (not shown). The top electrode 204 is electrically connected to a bit line or serves as one portion of a bit line.

The bottom electrode 201 and the top electrode 204 may be made of titanium nitride (TiN) or tantalum nitride (TaN). Alternatively, the bottom electrode 201 and the top electrode 204 may comprises tungsten (W), tungsten nitride (WN), aluminum titanium nitride (AlTiN) or aluminum tantalum nitride (AlTaN). The bottom electrode 201 and the top electrode 204 may also comprises at least one element dopant that is selected form a group consisting of Si, C, Ge, Cr, Ti, W, Mo, Al, Ta, Cu, Pt, Ir, La, Ni, N, O, Ru and the arbitrary combinations thereof.

The basis phase-change material may comprises $Ge_2Sb_2Te_5$. In some embodiment of the present invention, the basis phase change materials may comprise additives, such as silicon dioxide ($SiO_2$), having a concentration distribution to form an additive concentration profile along the inter-electrode current path between the bottom electrode 201 and the top electrode 204 and to define an active area 203a in the memory layer 203.

Figure 3:
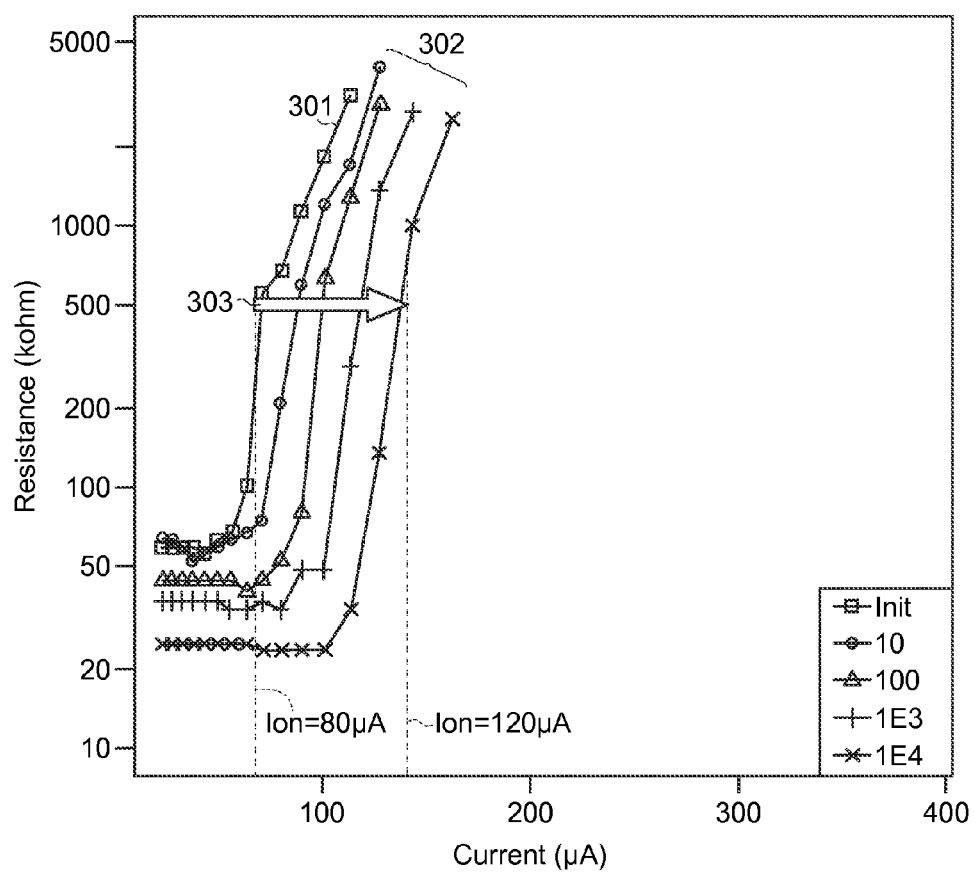
FIG. 3 is a graphical diagram illustrating the relationship between the resistance and the current of the phase-change material in accordance with one embodiment of the present invention.

In some embodiments of the present invention, the phase-change material of the active area 203a has an initial electrical property. For example, when a detection pulse is applied to the active area 203a relationship between the resistance and the current of the phase-change material may be obtained. FIG. 3 is a graphical diagram illustrating the relationship between the resistance and the current of the phase-change material in accordance with one embodiment of the present invention. In the present embodiment, the curve illustrating the initial relationship between the resistance and the current of the phase-change material can form a graph of function that is referred to as an initial I-R function 301.

Figure 4:
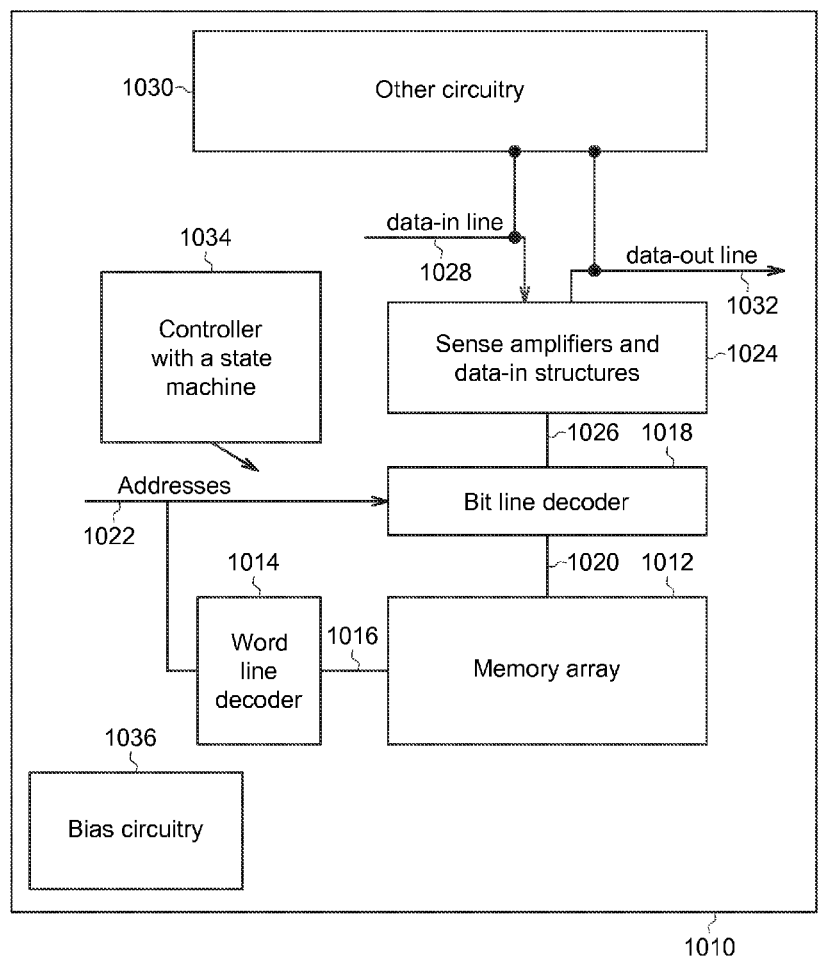
FIG. 4 is a is a simplified block diagram of an integrated circuit including a memory array implemented by the memory cells as described herein in accordance with one embodiment of the present invention.

FIG. 4 is a is a simplified block diagram of an integrated circuit 1010 including a memory array 1012 implemented by the memory cells 200 as described herein in accordance with one embodiment of the present invention. The integrated circuit 1010 comprises a memory array 1012, a word line decoder 1014, a plurality of word lines 1016, a bit line (column) decoder 1018, a plurality of bit lines 1020, a bus 1022, a sense circuitry (sense amplifiers) and data-in structures 1024. The word lines 1016 are arranged along rows in the memory array 1012; and the word line decoder 1014 is electrically connected to the memory array 1012 via the word lines 1016. The bit lines 1020 are arranged along columns in the memory array 1012, and the bit line (column) decoder 1018 is electrically connected to the memory array 1012 via the bit lines 1020 used to read, set or reset the memory cells 200 (not shown) in the memory array 1012. Addresses are supplied from the bus 1022 to word line decoder 1014 and bit line column decoder 1018. The sense circuitry (sense amplifiers) and data-in structures in block 1024, are coupled to the bit line column decoder 1018 via the data bus 1026. Data from input/output ports of the integrated circuit 1010, or from internal or external data sources of the integrated circuit 1010 is supplied, via a data-in line 1028, to the data-in structures in block 1024. Data is supplied via a data-out line 1032 from the sense amplifiers in block 1024 to input/output ports on integrated circuit 1010, or to other data destinations internal or external to integrated circuit 1010. A controller 1034 with a state machine is used to control the application voltage and current from the voltage and current sources in bias circuitry 1036 for the application of bias arrangements for the memory array 1012. Other circuitry 1030, such as a general purpose processor application circuitry or special purpose application circuitry, or a combination of modules providing may be included on integrated circuit 1010.

After a plurality numbers of read, set and reset operations are carried out, degradations of the phase-change material may occur due to the electrical energy subject to the phase-change material during the set/reset operations, the thermal stress of the operation temperature. In some embodiments of the present invention, degradations of the phase-change material may reveals by the translation of the initial I-R function 301. In the present embodiment, the translation of the initial I-R function 301 can be measured by applying a detection pulse to the active area 203a of the memory cell 200.

Refereeing to FIG. 3 again, when degradations of the phase-change material occurs, the initial I-R function 301 may transform into a shifted I-R function 302, wherein the shifted I-R function 302 is a translation function of the initial I-R function 301. In other words, the curve of the shifted I-R function 302 is substantially coincide with that of the initial I-R function 301 except the coordinates of these two curves of the initial I-R function 301 and the shifted I-R function 302. In the present embodiment, the curve of the shifted I-R function 302 is laterally shifted away from the curve of the initial I-R function 301 (see the arrow 303).

Figure 5:
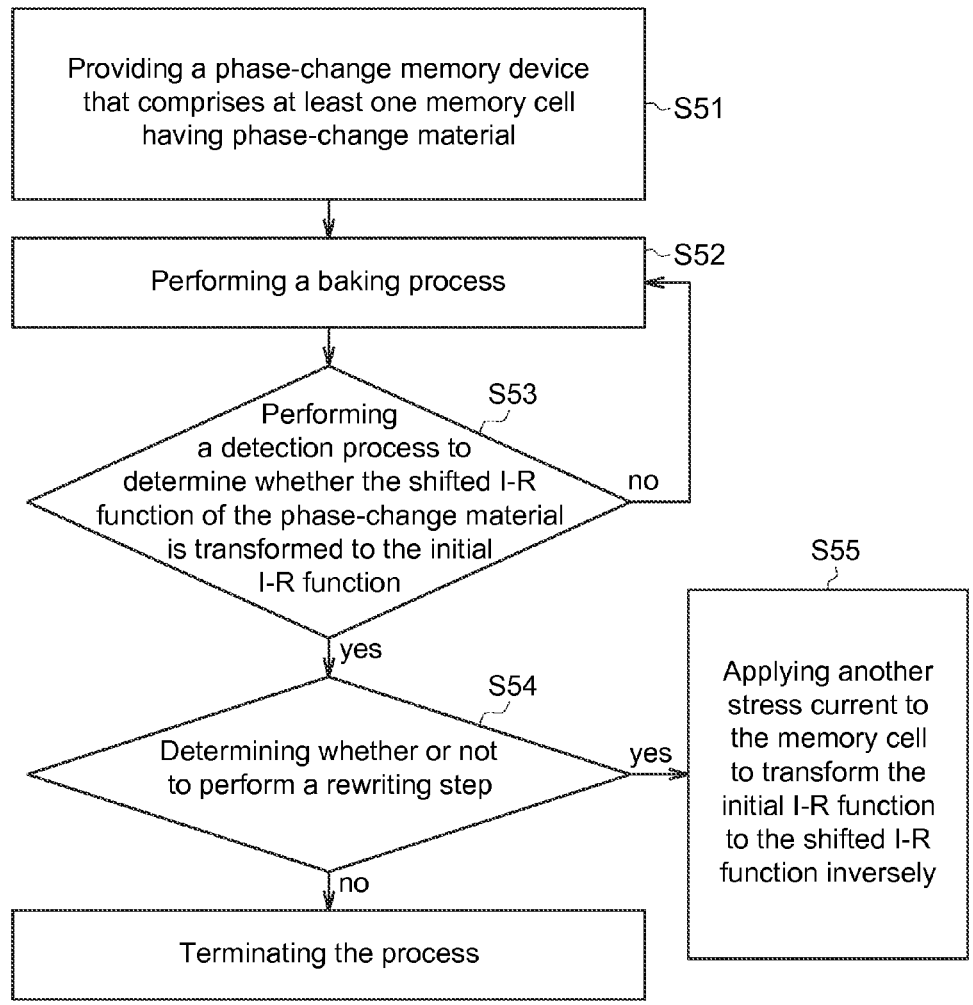
FIG. 5 is a process diagram illustrating the method for healing a phase-change memory device in accordance with one embodiment of the present invention.

In order to solve the material degradation problem, a method for healing a phase-change memory device is thus provided. FIG. 5 is a process diagram illustrating the method for healing a phase-change memory device in accordance with one embodiment of the present invention, wherein the method comprises steps as follows: A phase-change memory device that comprises at least one memory cell 200 having phase-change material is firstly provided, wherein the phase-change material has a shifted I-R function 302 (as shown in the step 51).

As discussed above, the process for providing the memory cell 200 comprising the phase-change material having the shifted I-R function 302 comprises steps of performing a set operation, a reset operation or the combination thereof to apply a stress current to the memory cell 200, so as to transform the initial I-R function 301 to the shifted I-R function 302. In some other embodiments, other electrical energy, thermal stress mechanical stress or the arbitrary combinations thereof may trigger the transformation from the initial I-R function 301 to the shifted I-R function 302.

Subsequently a healing stress is then applied to the phase-change material to transform the shifted I-R function 302 into an initial I-R function 301, wherein the shifted I-R function 302 is a translation function of the initial I-R function 301. In some embodiments of the present invention, the process of applying the healing stress to the phase-change material comprises steps of performing a baking process to transform the shifted I-R function 302 of the phase-change material to the initial I-R function 301 (see the step 52). In the present embodiment, the baking process has an operation temperature substantially ranging from 300° C. to 400° C., and a baking interval substantially ranging from 1 minute to 30 minutes.

Next, a detection process is performed to determine whether the shifted I-R function 302 of the phase-change material is transformed to the initial I-R function 301 (see the step 53). If the shifted I-R function 302 of the phase-change material is not transformed to the initial I-R function 301, the step 502 may be repeated to perform the baking process again, meanwhile the baking temperature may be increased. If the shifted I-R function 302 of the phase-change material is transformed to the initial I-R function 301, the process will proceed to determine whether or not to perform a rewriting step (see step 54). If the rewriting step is required, another stress current may be applied to the memory cell 200 to transform the initial I-R function 301 to the shifted I-R function 302 inversely (see step 55). If the rewriting step is not necessary, the process for healing the phase-change memory device will be terminated.

Figure 6:
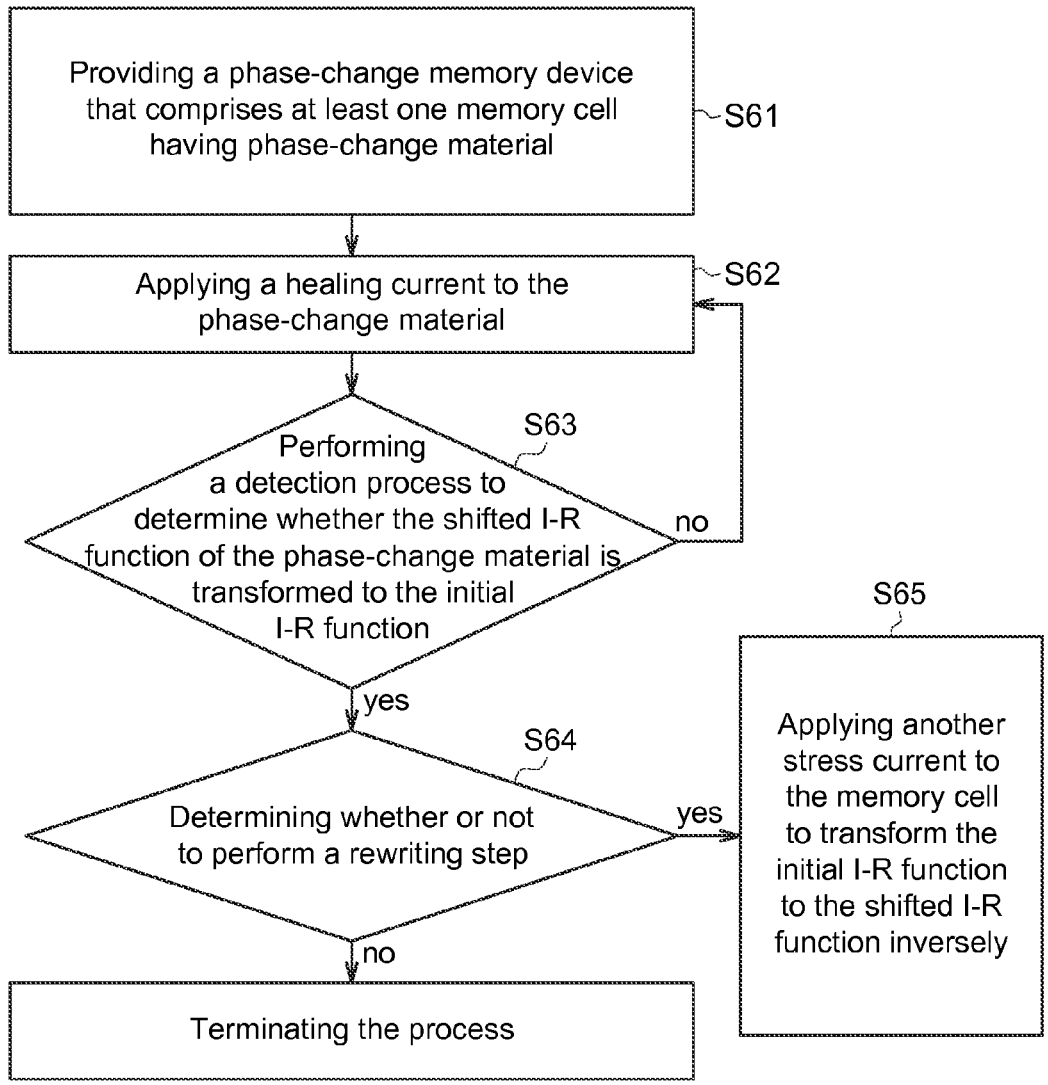
FIG. 6 is a process diagram illustrating the method for healing a phase-change memory device in accordance with another embodiment of the present invention.

FIG. 6 is a process diagram illustrating the method for healing a phase-change memory device in accordance with another embodiment of the present invention, wherein the method comprises steps as follows: A phase-change memory device that comprises at least one memory cell 200 having phase-change material is firstly provided, wherein the phase-change material has a shifted I-R function 302 to transform the shifted I-R function 302 of the phase-change material to the initial I-R function 301 (as shown in the step 61).

As discussed above, the process for providing the memory cell 200 comprising the phase-change material having the shifted I-R function 302 comprises steps of performing a set operation, a reset operation or the combination thereof to apply a stress current to the memory cell 200, so as to transform the initial I-R function 301 to the shifted I-R function 302, wherein the stress current has a upper limit value and a lower limit value. In the present embodiment, the stress current may substantially range from 200 µA to 500 µA.

Subsequently a healing stress is then applied to the phase-change material to transform the shifted I-R function 302 into an initial I-R function 301, wherein the shifted I-R function 302 is a translation function of the initial I-R function 301. In some embodiments of the present invention, the process of applying the healing stress to the phase-change material comprises steps of applying a healing current to the phase-change material (see step 62). In some embodiments of the present invention, the healing current may substantially range from 1 µA to 100 µA. In the present embodiment, the healing current may range from about ½ of the upper limit value of the stress current to about ⅕ of the lower limit value of the stress current (i.e. ranging about 250 µA to 40 µA).

Next, a detection process is performed to determine whether the shifted I-R function 302 of the phase-change material is transformed to the initial I-R function 301 (see the step 63). If the shifted I-R function 302 of the phase-change material is not transformed to the initial I-R function 301, the step 602 may be repeated to applying the healing current to the phase-change material again, meanwhile the density of the healing current may be increased. If the shifted I-R function 302 of the phase-change material is transformed to the initial I-R function 301, the process will proceed to determine whether or not to perform a rewriting step (see step 64). If the rewriting step is required, another stress current may be applied to the memory cell 200 to transform the initial I-R function 301 to the shifted I-R function 302 inversely (see step 65). If the rewriting step is not necessary, the process for healing the phase-change memory device will be terminated.

Since the shifted I-R function 302 of the phase-change material can be transformed to the initial I-R function 301, and the initial I-R function 301 can be transformed to the shifted I-R function 302 inversely, thus a new data accessing way different from the way depicted in FIG. 1 (using the high resistance state 102 and the low resistance state 101 to perform the set, reset and read operation) may be provided.

Figure 7:
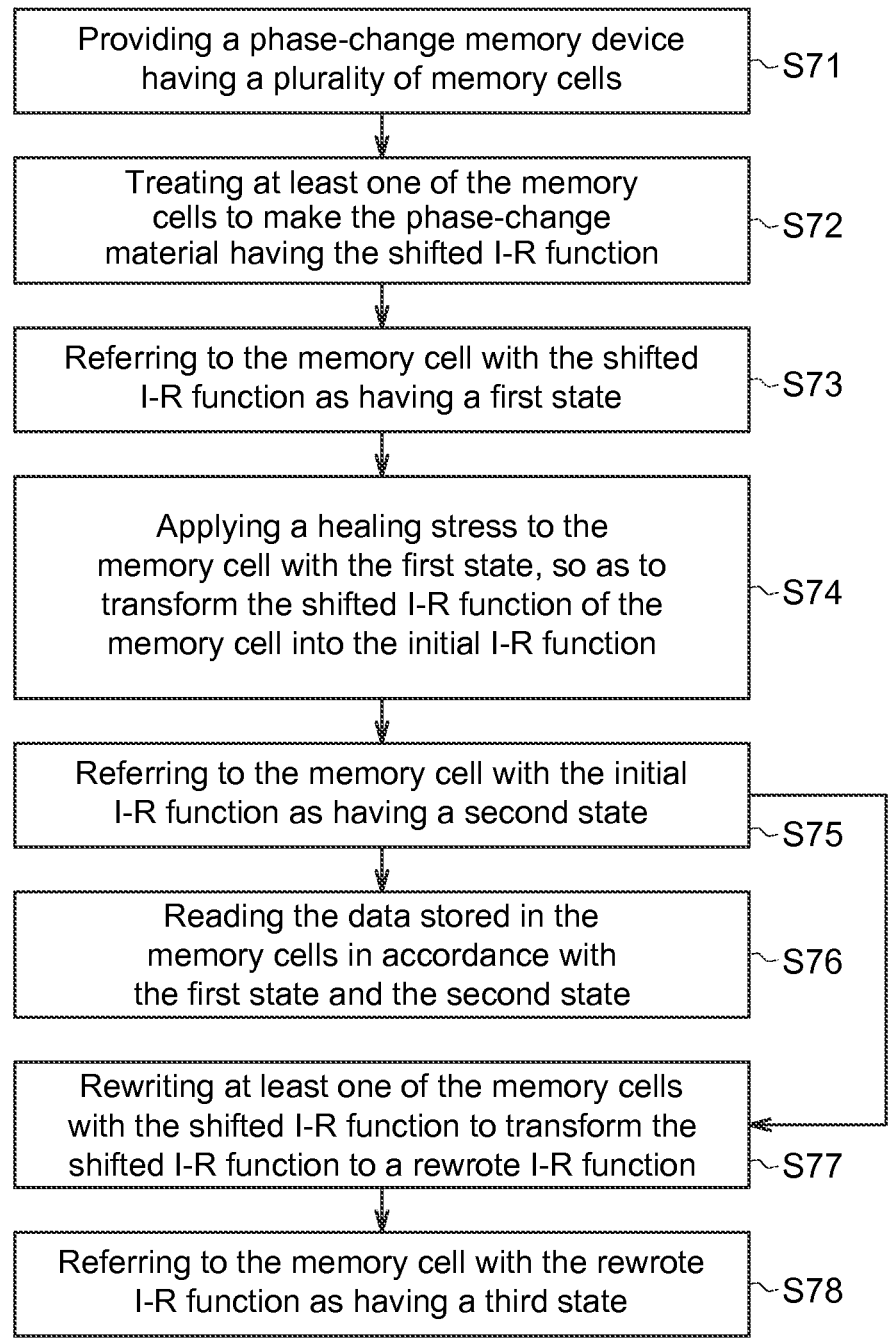
FIG. 7 is a process diagram illustrating a method for operating a phase-change memory device in accordance with one embodiment of the present invention.

FIG. 7 is a process diagram illustrating a method for operating a phase-change memory device in accordance with one embodiment of the present invention, wherein the method comprises steps as follows: Firstly, a phase-change memory device having a plurality of memory cells is provided (see step 71), wherein each of the memory cells has phase-change material. At least one of the memory cells is then treated to make the phase-change material having the shifted I-R function 302 (see step 72), and the memory cell with the shifted I-R function 302 is then referred to as having a first state (see step 73). Next, a healing stress is applied to the memory cell with the first state, so as to transform the shifted I-R function 302 of the memory cell into the initial I-R function 301 (see step 74), wherein the shifted I-R function 302 is a translation function of the initial I-R function 301. Subsequently, the memory cell with the initial I-R function 301 is referred to as having a second state (see step 75), and data stored in the memory cells is read in accordance with the first state and the second state (see step 76). Since the setting and transformation of the initial I-R function 301 and the shifted I-R function 302 of the memory cell 200 has been disclosed in the aforementioned embodiments, thus the detailed process for treating the memory cells 200 will not redundantly described.

In the present embodiment, the memory cells with the shifted I-R function 302 that have been subject to electrical energy, thermal stress, mechanical stress or the combinations thereof may be referred to as having the first state, and the memory cells that are not subject to electrical energy, thermal stress, mechanical stress or the combinations thereof or have been healed by the aforementioned healing method may be referred to as having the second state. The integrated circuit 1010 as depicted in FIG. 4 can be applied to read the data stored in the memory array 1012 in accordance with the first state and the second state.

Of noted that, in some embodiments of the present invention, the method for operating the phase-change memory device further comprises steps of rewriting at least one of the memory cells with the shifted I-R function 302 to transform the shifted I-R function 302 to a rewritten I-R function (see step 77), and the memory cell with the rewritten I-R function is then referred to as having a third state (see step 78) to provide the integrated circuit 1010 reading out, wherein the rewritten I-R function is also a translation function of the initial I-R function. For example, the rewritten I-R function may be one of the curves depicted in FIG. 3 representing the shifted I-R function 302.

In accordance with the aforementioned embodiments of the present invention, a method for healing a phase-change memory device is provided. By applying a healing stress to phase-change materials of a memory cell, the degradation of the phase-change materials caused by electrical energy subject to the phase-change materials during the set/reset operations, the operation temperature or the combination thereof can be healed, and the electrical properties, such as the I-R function of the memory cell, can be recovered to return to the initial state. As a result, the problems of bit error and high current consumption caused by the degradation of the phase-change materials can be obviated.

In addition the reversible property between the shifted I-R function and the initial I-R function can provide a new way for accessing data stored in the memory cell. Such that the memory density of the phase-change memory device can be increased significantly without changing the physical structure thereof.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for healing a phase-change memory device, comprising:
    providing at least one memory cell comprising a phase-change material with a shifted current-resistance characteristic function (shifted I-R function), wherein the process for providing the memory cell comprises steps of:
    making the phase-change material of the memory cell having an initial I-R function (initial I-R function); and
    performing a set operation, a reset operation or the combination thereof to apply a stress current to the memory cell, so as to transform the initial I-R function to the shifted I-R function; and
    applying a healing stress to the phase-change material to transform the shifted I-R function into the initial I-R function, wherein the shifted I-R function is a translation function of the initial I-R function, wherein the process of applying the healing stress to the phase-change material comprises steps of applying a healing current to the phase-change material, and the healing current substantially ranges from ½ of the upper limit value of the stress current to ⅕ of the lower limit value of the stress current.

2. The method according to claim 1, wherein the process of applying the healing stress to the phase-change material further comprises step of performing a baking process.

3. The method according to claim 2, wherein the baking process has an operation temperature substantially ranging from 300° C. to 400° C., and a baking interval substantially ranging from 1 minute to 30 minutes.

4. The method according to claim 1, wherein the stress current substantially ranges from 200 μA to 500 μA.

5. The method according to claim 1, wherein the process for providing the memory cell further comprises steps of:
    applying an electrical energy, a thermal stress, a mechanical stress or the arbitrary combinations thereof to transform the initial I-R function to the shifted I-R function.

6. The method according to claim 1, further comprising performing a rewriting step to transform the initial I-R function to a rewritten current-resistance characteristic function (rewritten I-R function) inversely.

7. The method according to claim 1, wherein the process of applying the healing stress to the phase-change material further comprises steps of:
    performing a detection process to determine whether the shifted I-R function of the phase-change material is transformed to the initial I-R function; and
    applying the healing stress to the phase-change material again, if the shifted I-R function of the phase-change material is not transformed to the initial I-R function.

8. The method according to claim 7, wherein the detection process comprises steps of applying a detection pulse to the phase-change material.

9. A method for operating a phase-change memory device, comprising:
    providing a phase-change memory device having a plurality of memory cells, wherein each of the memory cells has phase-change material;
    treating at least one of the memory cells to make the phase-change material having a shifted I-R function, wherein the process of treating at least one of the memory cells to make the phase-change material having the shifted I-R function comprises steps of:
    making the phase-change material of the memory cell having an initial I-R function; and
    performing a set operation, a reset operation or the combination thereof to apply a stress current to the memory cell, so as to transform the initial I-R function to the shifted I-R function;
    referring to the memory cell with the shifted I-R function as having a first state;

applying a healing stress to the memory cell with the first state, so as to transform the shifted I-R function of the memory cell into the initial I-R function, wherein the shifted I-R function is a translation function of the initial I-R function, wherein the process of applying the healing stress to the memory cell with the first state comprises steps of applying a healing current to the phase-change material, and the healing current substantially ranges from ½ of the upper limit value of the stress current to ⅕ of the lower limit value of the stress current;

referring to the memory cell with the initial I-R function as having a second state; and reading data stored in the memory cells in accordance with the first state and the second state.

10. The method according to claim 9, wherein the process of applying the healing stress to the memory cell with the first state further comprises step of performing a baking process.

11. The method according to claim 10, wherein the baking process has an operation temperature substantially ranging from 300° C. to 400° C., and a baking interval substantially ranging from 1 minute to 30 minutes.

12. The method according to claim 9, wherein the stress current substantially ranges from 200 µA to 500 µA.

13. The method according to claim 9, wherein the process of treating at least one of the memory cells to make the phase-change material having the shifted I-R function further comprises steps of applying an electrical energy, a thermal stress, a mechanical stress or the arbitrary combinations thereof to transform the initial I-R function to the shifted I-R function.

14. The method according to claim 9, further comprising steps of:

rewriting at least one of the memory cells with the shifted I-R function to transform the shifted I-R function to a rewritten I-R function; and referring to the memory cell with the rewritten I-R function as having a third state.

15. The method according to claim 9, wherein the process of applying the healing stress to the phase-change material further comprises steps of:

performing a detection process to determine whether the shifted I-R function of the phase-change material is transformed to the initial I-R function; and applying the healing stress to the phase-change material again, if the shifted I-R function of the phase-change material is not transformed to the initial I-R function.

16. The method according to claim 15, wherein the detection process comprises steps of applying a detection pulse to the phase-change material.

* * * * *